(12) United States Patent
Alasirniö et al.

(10) Patent No.: US 9,826,131 B2
(45) Date of Patent: Nov. 21, 2017

(54) COMPACT CAMERA MODULE ARRANGEMENTS THAT FACILITATE DAM-AND-FILL AND SIMILAR ENCAPSULATION TECHNIQUES

(71) Applicant: Heptagon Micro Optics Pte. Ltd., Singapore (SG)

(72) Inventors: Jukka Alasirniö, Jääli (FI); Stephan Heimgartner, Passugg (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/024,133

(22) PCT Filed: Sep. 17, 2014

(86) PCT No.: PCT/SG2014/000440
§ 371 (c)(1),
(2) Date: Mar. 23, 2016

(87) PCT Pub. No.: WO2015/041602
PCT Pub. Date: Mar. 26, 2015

(65) Prior Publication Data
US 2016/0241749 A1    Aug. 18, 2016

Related U.S. Application Data

(60) Provisional application No. 61/881,241, filed on Sep. 23, 2013.

(51) Int. Cl.
*H04N 5/225* (2006.01)
*H01L 27/146* (2006.01)
*H05K 3/28* (2006.01)

(52) U.S. Cl.
CPC ..... *H04N 5/2257* (2013.01); *H01L 27/14618* (2013.01); *H01L 27/14627* (2013.01);
(Continued)

(58) Field of Classification Search
CPC .. H04N 5/2253; H04N 5/2254; H04N 5/2257; H05K 3/284; H05K 2201/10151;
(Continued)

(56) References Cited

U.S. PATENT DOCUMENTS 6,384,472 B1   5/2002  Huang
6,930,398 B1 * 8/2005  Sun ................... H01L 27/14618
                                               257/729
(Continued)

OTHER PUBLICATIONS

Australian Patent Office, International Search Report and Written Opinion, issued by ISA/AU in International Patent Application No. PCT/SG2014/000440 (dated Jan. 21, 2015).

*Primary Examiner* — Lin Ye
*Assistant Examiner* — Chriss Yoder, III
(74) *Attorney, Agent, or Firm* — Fish & Richardson P.C.

(57) ABSTRACT

Compact camera module can include auxiliary spacers to facilitate use of dam-and-fill encapsulation techniques. An encapsulant disposed on side edges of the auxiliary spacer can close off a gap between the auxiliary spacer and a support on which an image sensor is mounted so as to substantially seal off an area in which bond wires or other components are located. In some cases, the thickness of a transmissive substrate in the module can be reduced near its periphery to provide more head room for the bond wires, which can result in a smaller overall footprint for the module.

21 Claims, 6 Drawing Sheets

(52) U.S. Cl.
CPC ..... *H01L 27/14636* (2013.01); *H04N 5/2252* (2013.01); *H05K 3/284* (2013.01); *H01L 2224/48091* (2013.01); *H01L 2924/19105* (2013.01)

(58) Field of Classification Search
CPC ........ H05K 2203/1316; H01L 21/563–21/566; H01L 21/67126; H01L 23/28; H01L 23/293–23/296; H01L 23/3142; H01L 23/315; H01L 27/14618; H01L 27/14634; H01L 27/14683; H01L 27/1469
See application file for complete search history.

(56) References Cited

U.S. PATENT DOCUMENTS

| | | |
|---|---|---|
| 7,863,702 B2 | 1/2011 | Seo et al. |
| 2007/0090478 A1 | 4/2007 | Chen et al. |
| 2007/0194439 A1 | 8/2007 | Kawabata |
| 2007/0272827 A1 | 11/2007 | Heo et al. |
| 2009/0215216 A1* | 8/2009 | Huang .............. H01L 27/14618 438/65 |
| 2009/0267170 A1 | 10/2009 | Chien et al. |

* cited by examiner

COMPACT CAMERA MODULE ARRANGEMENTS THAT FACILITATE DAM-AND-FILL AND SIMILAR ENCAPSULATION TECHNIQUES

FIELD OF THE DISCLOSURE

The present disclosure relates to compact camera module arrangements that can be integrated with dam-and-fill and similar encapsulation techniques.

BACKGROUND

Encapsulation is the process of covering electronic components in a protective shell in order to prevent physical damage following die and wire bonding. One type of encapsulation is referred to as dam-and-fill.

Dam-and-fill encapsulation provides a dam around the periphery of a component for the purpose of preventing flow of the encapsulant to adjacent components. There are several different types of dams that can be used. For example, mechanical dams serve as physical walls that are built into the substrate around the die placement area, whereas silicone and double viscosity dams include a line of silicone or high-viscosity encapsulant that is dispensed around the periphery of the component. In each case, a low-viscosity encapsulant (i.e., a liquid fill) can then be dispensed over the component so as to fill the area of the dam. The liquid fill encapsulant thus encapsulates and protects the die and wire bonds.

Dam-and-fill techniques can be used, for example, to encapsulate various parts of compact optoelectronic modules. For example, as shown in FIG. 1A, dam-and-fill techniques can be used to provide encapsulation 10 for wires 12 and bond pads 14, or other electronic components 16, on a printed circuit board (PCB) substrate 18 on which an optoelectronic module 20 is mounted. In the illustrated example, the module 20 is a compact camera module that includes a lens stack 22 disposed over a transparent substrate 24, which separates the lens stack 22 from an image sensor 26. The wires 12 electrically couple the image sensor 26 to the bond pads 14 on the PCB substrate 18.

In some cases, as shown in the example of FIG. 1B, it may be desirable to make the width of the lens stack 22 and the transparent substrate 24 wider than the image sensor 26 so as to obtain a wider field of view. However, such situations can raise challenges in using dam-and-fill techniques to encapsulate the wires 12 and bond pads 14. In particular, difficulties can arise because the wires 12 and bond pads 14 are located in a space beneath the transparent substrate 24, where it is difficult to introduce the encapsulant. Yet, if that space is not completely filled, the bond wires 12 may not be entirely embedded within the encapsulant, and the module may not be sufficiently rigid or stable.

SUMMARY

The present disclosure describes various compact camera module designs that address the issues discussed above such that dam-and-fill techniques can be used to protect wiring, bond pads and/or other electronic components even if, for example, the lens stack or the transparent substrate is wider than the image sensor.

According to one aspect, auxiliary spacers are provided to facilitate use of dam-and-fill encapsulation techniques. An encapsulant disposed on side edges of the auxiliary spacer can close off a gap between the auxiliary spacer and a support on which an image sensor is mounted so as to substantially seal off an area in which bond wires, bond pads or other components are located. In some cases, a small ventilation hole is provided in the encapsulant so as to control pressure in the area in which the bond wires and bond pads are located.

For example, a compact camera module can include a stack of one or more optical elements (e.g., lenses), and an optically transmissive substrate, wherein the stack of one or more optical elements is attached to a first side of the transmissive substrate. An image sensor is mounted on a support, and the optically transmissive substrate is separated from the image sensor by a first spacer attached to a second side of the transmissive substrate. A second (auxiliary) spacer is attached to the transmissive substrate at or near its periphery. The second spacer extends from the transmissive substrate toward, but does not reach, the support on which the image sensor is mounted. Wires electrically couple the image sensor to the support on which the image sensor is mounted and are located in a space between the first and second spacers. The camera module can further include an encapsulant disposed on side edges of the second spacer. A portion of the encapsulant substantially closes off a gap between the second spacer and the support on which the image sensor is mounted.

According to another aspect, the thickness of the optically transmissive substrate can be reduced near its periphery to provide more head room for the bond wires, which can result in a smaller overall footprint for the module. For example, the optically transmissive substrate can include a middle section that has a first thickness, and a second section near the periphery of the transmissive substrate having a second smaller thickness. One or more of the wires can be connected to a portion of the image sensor located below the second thinner section of the optically transmissive substrate.

In some implementations, a dam structure can be placed sufficiently close to the sidewalls of the optically transmissive substrate that the addition of the fill material can be omitted.

Other aspects, features and advantages will be apparent from the following detailed description, the accompanying drawings and the claims.

DETAILED DESCRIPTION

Figure 2:
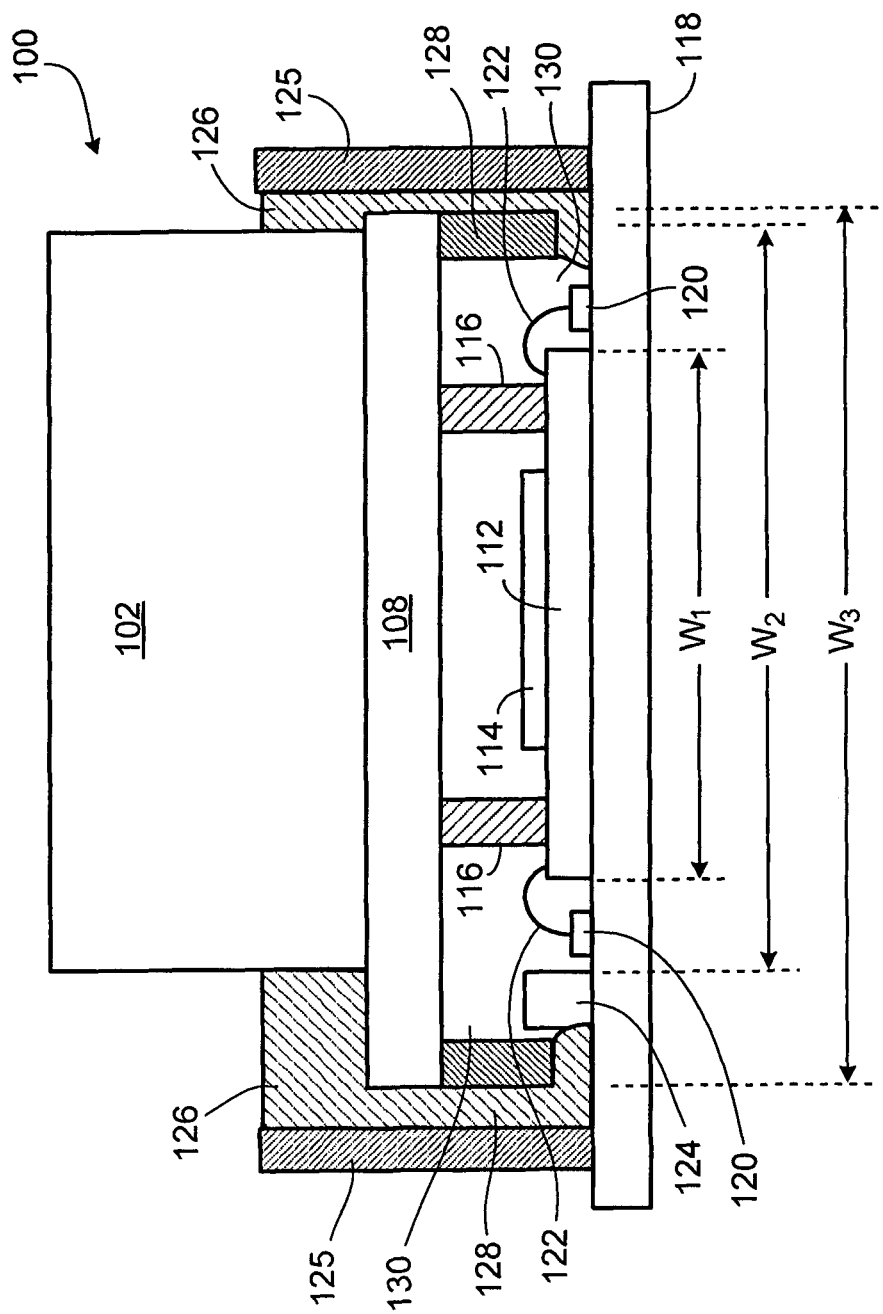
FIG. 2 illustrates an example of a camera module according to the invention.

As shown in FIG. 2, a compact camera module 100 includes a stack 102 of passive optical elements (e.g., plastic lenses) disposed over a transmissive flange focal length (FFL) correction substrate 108. In some implementations, the lens stack 102 includes lenses attached to a lens barrel or other lens holder. Details of the lens stack 102 may differ in other implementations. In some implementations, the lens stack 102 can be made, for example, using an injection molding technique or as part of a wafer-level fabrication process. In some cases, there may be a spacer separating the lens stack 102 and the upper surface of the FFL correction substrate 108. The top of the lens stack 102 can include an opening or transparent cover to allow light to enter and be directed by the lens stack 102 through the transmissive FFL correction substrate 108 toward an image sensor 112 that includes a photosensitive area 114 composed of light-detecting elements (e.g., CCDs or photodiodes). The FFL correction substrate 108 can be composed, for example, of a substantially transparent material (e.g., glass) with specified properties (e.g., to allow light of a particular wavelength or within a particular wavelength range to pass with little or no attenuation).

Some implementations include two or more adjacent optical channels, or an array of optical channels, each of which allows incoming light to pass to a respective sub-group of light-detecting elements on the image sensor 112. In such implementations, the module would include multiple lens stacks 102 aligned side-by-side, where each lens stack corresponds to one of the channels. The thickness of the FFL correction substrate 108 in each optical channel can be selected or adjusted to provide FFL correction for the individual optical channels. Adjustment of the thickness of the FFL correction substrate 108 may involve the addition or removal of material.

As further shown in the example of FIG. 2, the transmissive FFL substrate 108 is separated from the image sensor 112 by a non-transparent spacer 116. The thickness of the spacer 116 can be selected or adjusted to provide additional FFL correction for the module. The spacer 116 can be implemented, for example, as a single continuous (e.g., annular-shaped) spacer that surrounds the photosensitive area 114 of the image sensor 112

The image sensor 112 can be mounted on a support such as a printed circuit board (PCB) substrate 118 and can be electrically coupled to bond pads 120 on the PCB substrate 118 through thin conductive wires 122. Other electrical components 124 (e.g., a capacitor) also may be mounted on the PCB substrate 118.

Figure 1A:
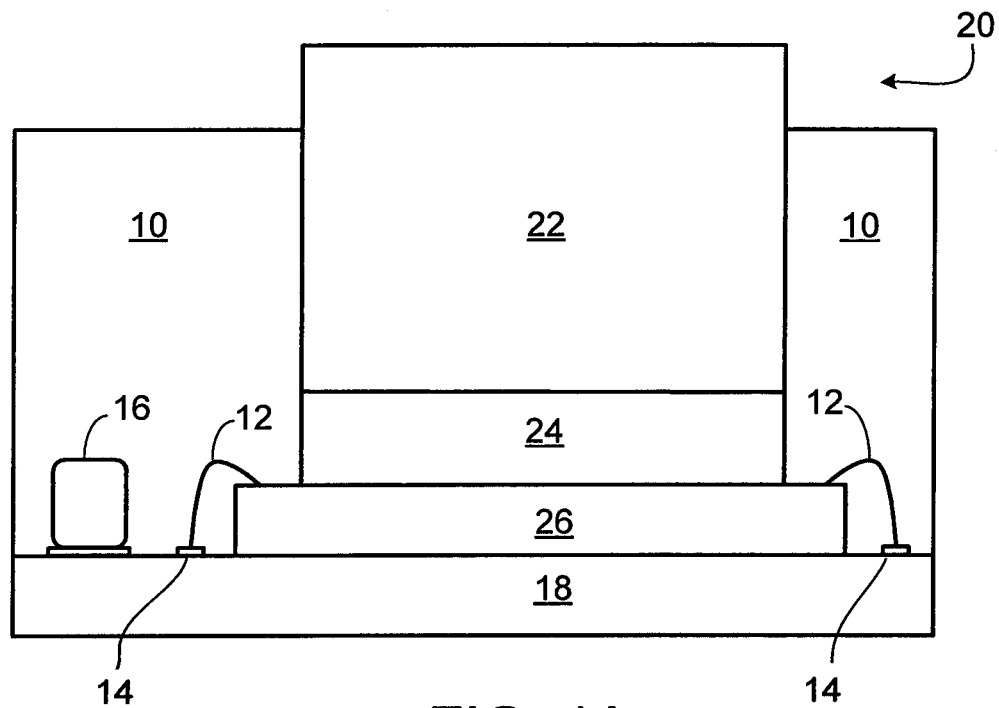
FIG. 1A illustrates an example of a camera module.
Figure 1B:
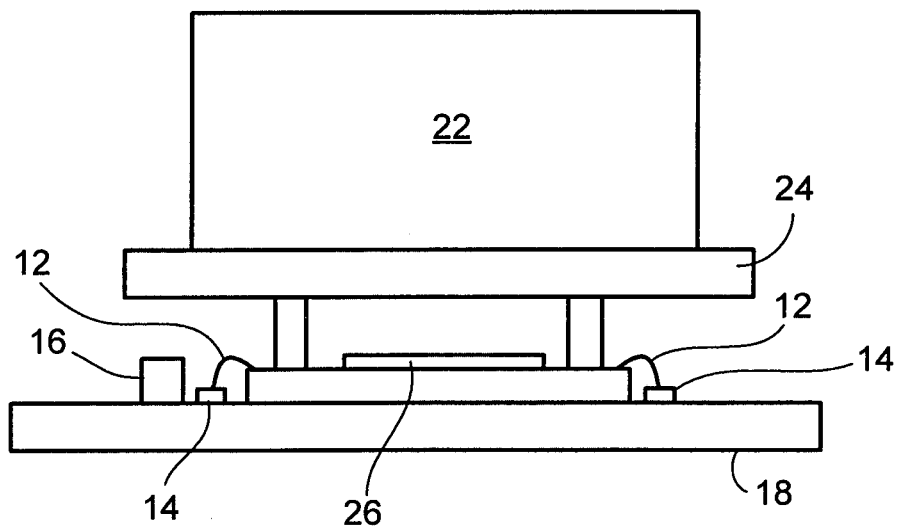
FIG. 1B illustrates another example of a camera module.

As shown in FIG. 2, the width (w1) of the image sensor 112 is less than the corresponding width (w2) of the lens stack 102 as well as the width (w3) of the FFL correction substrate 108. The foregoing feature can be advantageous because it allows the overall footprint of the module 100 to be made smaller. In particular, the width (w4) of the PCB substrate 118 can be reduced by mounting the bond pads 120 (and other components 124) on areas of the PCB substrate 118 that are under the lens stack 102 and/or the FFL correction substrate 108. Such a design differs from the module of FIG. 1A, in which the bonding pads 14 and wires 12 are disposed on an area of the substrate 18 that extends beyond the footprint of the lens stack 22, transparent substrate 24 and image sensor 26.

Figure 3:
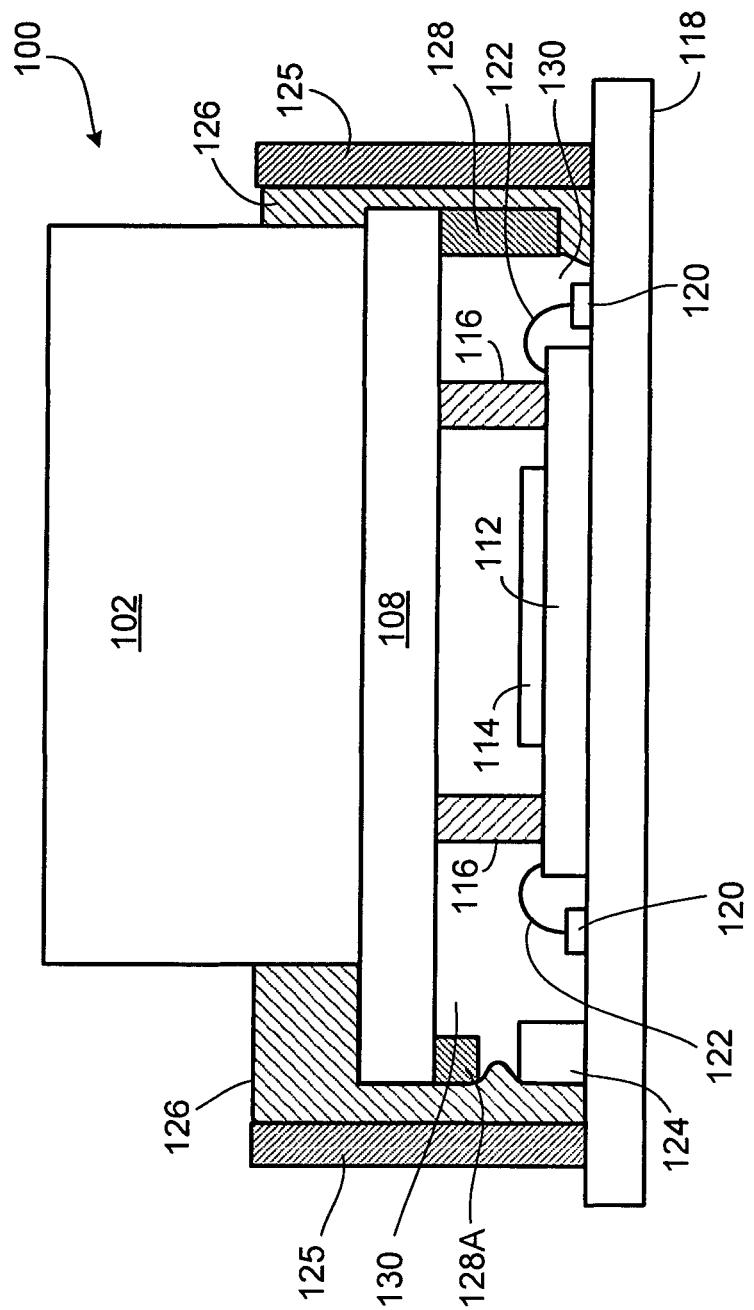
FIG. 3 illustrates another example of a camera module according to the invention.

To facilitate the addition of a dam-and-fill type encapsulation 126 to protect the bond pads 120, wires 122 and other components 124, auxiliary spacers 128 are provided on the image sensor-side of the FFL correction substrate 108 near or at its periphery. In some implementations, the height of the auxiliary spacers 128 is about the same as the height of the spacer 116 that separates the FFL correction substrate 108 from the image sensor 112. Thus, in some implementations, the height of the auxiliary spacers 128 is slightly less than the distance between the PCB substrate 118 and the FFL correction substrate 108. In other cases, as shown in the module 100A of FIG. 3, the height of an auxiliary spacer 128A can be reduced to allow a component 124 to be mounted on the PCB substrate 118 directly below the auxiliary spacer 128A. Such an arrangement can further reduce the overall footprint of the module 100A in some cases.

In some implementations, the auxiliary spacer(s) 128 (or 128A) can be implemented as a single continuous (e.g., annular-shaped) spacer that encircles the spacer 116. Each of the spacers 116, 128 can be composed, for example, of a polymer material (e.g., epoxy, acrylate, polyurethane, or silicone) containing a non-transparent filler (e.g., a pigment, inorganic filler, or dye). The spacers 116, 128 can be formed using any one of a number of techniques. For example, the spacers 116, 128 can be provided by a vacuum injection technique. Alternatively, the spacers 116, 128 can be provided as part of a wafer-level fabrication process in which a spacer wafer (with openings in regions between adjacent spacer elements) is attached to a FFL correction substrate wafer. In some implementations, the spacer 116 may be referred to as inner or first spacer, whereas the auxiliary spacer 128 may be referred to as an outer or second spacer. The presence of the auxiliary spacer 128 results in the bond pads 120, wires 122, and other components 124 (if present) being located in an interior space 130 between the laterally spaced spacers 116 and 128 and the vertically spaced substrates 108, 118.

When the dam-and-fill type encapsulation material 126 is applied inside the area defined by the dam 125, a small amount of the material enters the gap between the image sensor-side of the spacer 128 and the PCB substrate 118 (or between the spacer 128A and the components 124 mounted on the PCB substrate 118), and seals off the space 130 containing bond pads 120, the wires 122, and other components 124 (if present). In some cases, it may be desirable to provide a small ventilation hole to control pressure in the space 130.

In any event, the result can be a relatively compact camera module 100 with dam-and-fill encapsulation for the bond pads 120 and wires 122, even though the width of the image sensor 112 is less than the corresponding width of the lens stack 102 and the width of the FFL correction substrate 108.

Figure 4:
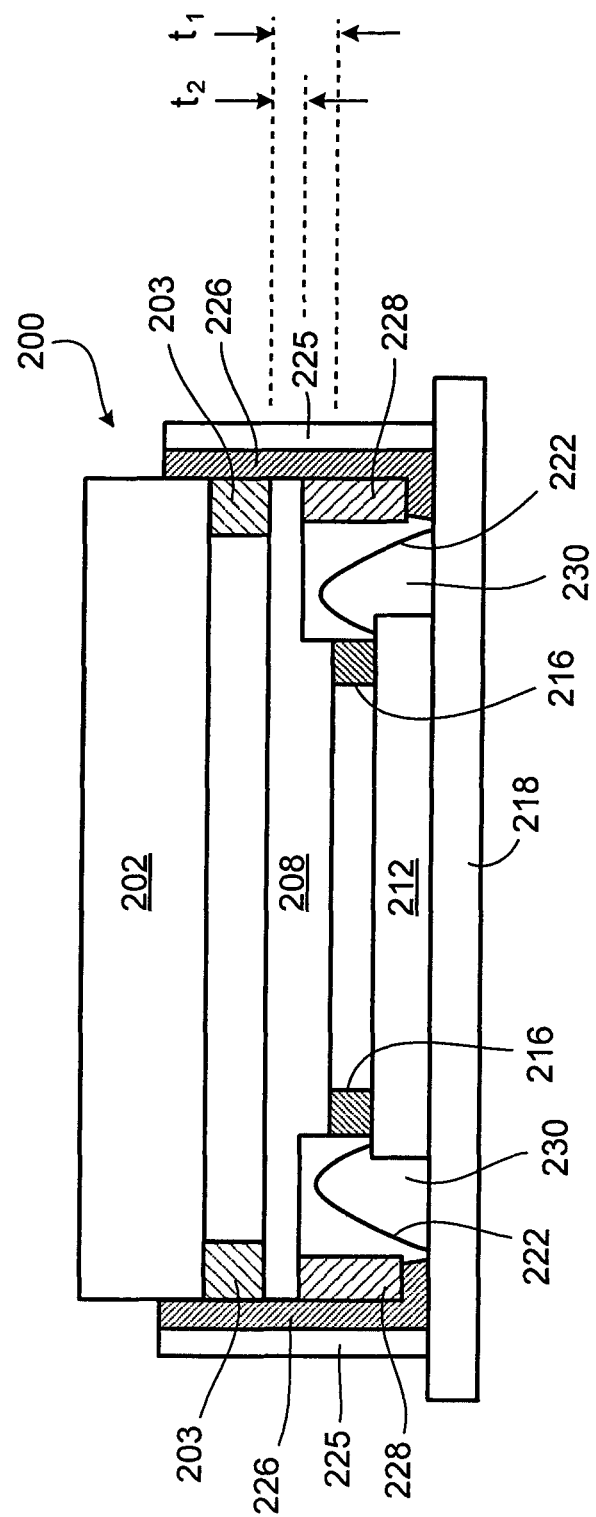
FIG. 4 illustrates another example of a camera module according to the invention.

For some sensor geometries, it may be desirable to adjust the shape and/or dimensions of the FFL correction substrate or the module FFL correction spacer. Such adjustments can be useful, for example, to provide additional space for the bond wires. An example is illustrated in FIG. 4, which shows a camera module 200 that includes a lens stack 202 over an image sensor 212 with a transmissive FFL correction substrate 208 disposed between the lens stack and the image sensor. The lens stack 202 is separated from the FFL correction substrate 208 by spacers 203, and the FFL correction substrate 208 is separated from the image sensor 212 by spacers 216. Bond wires 222 connect the image sensor 212, which is mounted on a PCB substrate 218, to conductive pads on the PCB substrate. As in the implementation of FIG. 2, auxiliary spacers 228 are provided on the image sensor-side of the FFL correction substrate 208 at or near its periphery. Each of the spacers 203, 216 as well as the auxiliary spacers 228 can be implemented, respectively, as a single continuous (e.g., annular shaped) spacer. Also, as in the examples of FIGS. 2 and 3, the width of the image sensor 212 is less than the corresponding width of the lens stack 202 and the width of the FFL correction substrate 208.

In order to accommodate the height of the wires 222 and still maintain a relatively compact module 200, the thickness of the FFL correction substrate 208 can be reduced in areas near, and preferably adjacent, its periphery. As shown in the example of FIG. 4, the FFL correction substrate 208 has a first thickness (t1) in the middle, but a smaller second thickness (t2) in the areas near its outer edge. In particular, the thickness of the FFL correction substrate 208 can be reduced near its periphery, for example, by micromachining or etching the FFL correction substrate 208 on the image sensor-side. Reducing the thickness of the FFL correction substrate 208 can result in a greater height of the interior space 230 for the bond wires 222.

In the example of FIG. 4, the auxiliary spacer 228 has a height (i.e., distance from its top to its bottom) greater than the height of the spacer 216. The top of the auxiliary spacer 228 is closer than the top of the spacer 216 to the lens stack 202. In addition, the bottom of the auxiliary spacer 228 is closer than the bottom of the spacer 216 to the top surface of the PCB substrate 218. Dam-and-fill encapsulant 226 can be provided in the area inside the dam 225 in a manner similar to that discussed in connection with FIGS. 2 and 3. Thus, the encapsulant 226 can fill a gap between the bottom of the auxiliary spacer 228 and the top surface of the PCB substrate 218 so as to seal off and protect the wires 222.

Figure 5:
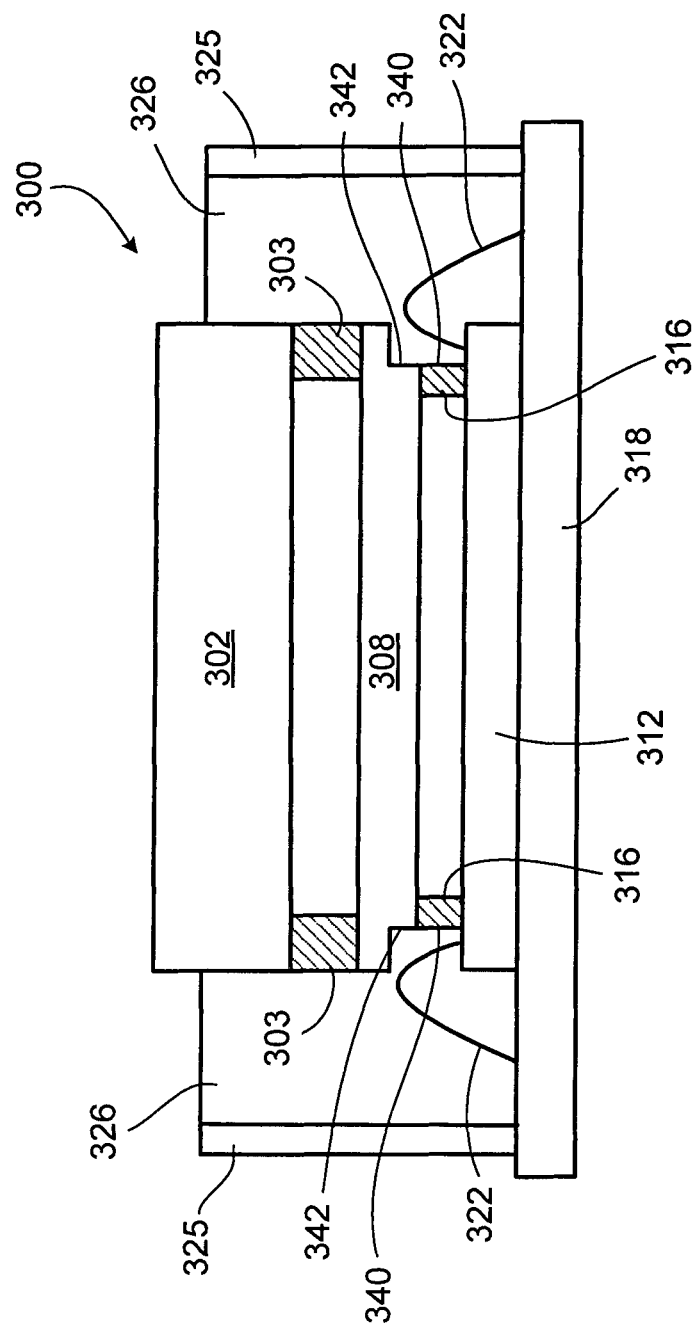
FIG. 5 illustrates another example of a camera module according to the invention.

The foregoing technique of providing a FFL correction substrate that is thinned near its periphery can be advantageous even for modules in which the width of the image sensor is not less than the corresponding widths of the lens stack and FFL correction substrate. An example is illustrated in FIG. 5, shows a camera module 300 that includes a lens stack 302 over an image sensor 312 with a transmissive FFL correction substrate 308 disposed between the lens stack and the image sensor. The lens stack 302 is separated from the FFL correction substrate 308 by first spacers 303, and the FFL correction substrate 308 is separated from the image sensor 312 by second spacers 316. Bond wires 322 connect the image sensor 312, which is mounted on a PCB substrate 318, to conductive pads on the PCB substrate. Each of the spacers 203, 216 can be implemented, respectively, as a single (annular-shaped) continuous spacer. In this example, the width of the image sensor 312 is about the same as the width of the lens stack 302 and FFL correction substrate 308.

As shown in FIG. 5, the thickness of the FFL correction substrate 308 is reduced in areas adjacent its periphery. In particular, the thickness of the FFL correction substrate 308 can be reduced, for example, by micromachining or etching the FFL correction substrate 308 on the image sensor-side near its periphery. The width of the spacers 316 can be reduced as well such that the outer side edges 340 of the spacers 316 are substantially flush with the corresponding narrower outer side edges 342 of the FFL correction substrate 308. The reduced thickness of the FFL substrate 308 near its periphery combined with the reduced width of the spacers 316 means, that in some cases, the bond wires 322 do not need to extend as far laterally beyond the vertical side edges of image sensor 312 before connection to conductive pads on the PCB substrate 318. This allows the overall footprint of the module 300, including its connections to the PCB substrate 318, to be reduced. Dam-and-fill encapsulant 326 can be provided inside the area defined by dam 325 in a manner similar to that discussed in the foregoing implementations. However, in contrast to the implementations of FIGS. 2-4, there is no need for the auxiliary spacers (e.g., 128, 228) to be provided for the implementation of FIG. 5.

Each of the foregoing modules 100, 100A 200, 300 can be implemented to have a single optical channel, two or more adjacent optical channels, or an array of optical channels.

In some cases, it can be helpful to provide a support for the dam. In such cases, various components that are present on the substrate (e.g., 118, 218 or 318) can act as a support structure for the dam. This can be particularly useful where the dam is relatively high and, without further support, could become unstable. Furthermore, if such components are located in a convenient position on the substrate and have a sufficient height, they can be used instead of a separate dam structure. In such cases, less material for the dam structure may be required. Likewise, some implementations may include additional metal or plastic parts that form a frame around the module. Such parts can be used as a dam or as a support for the dam. If such a frame around module is in place, then the dam can be replaced in whole or in part by the encapsulant fill material.

Figure 6:
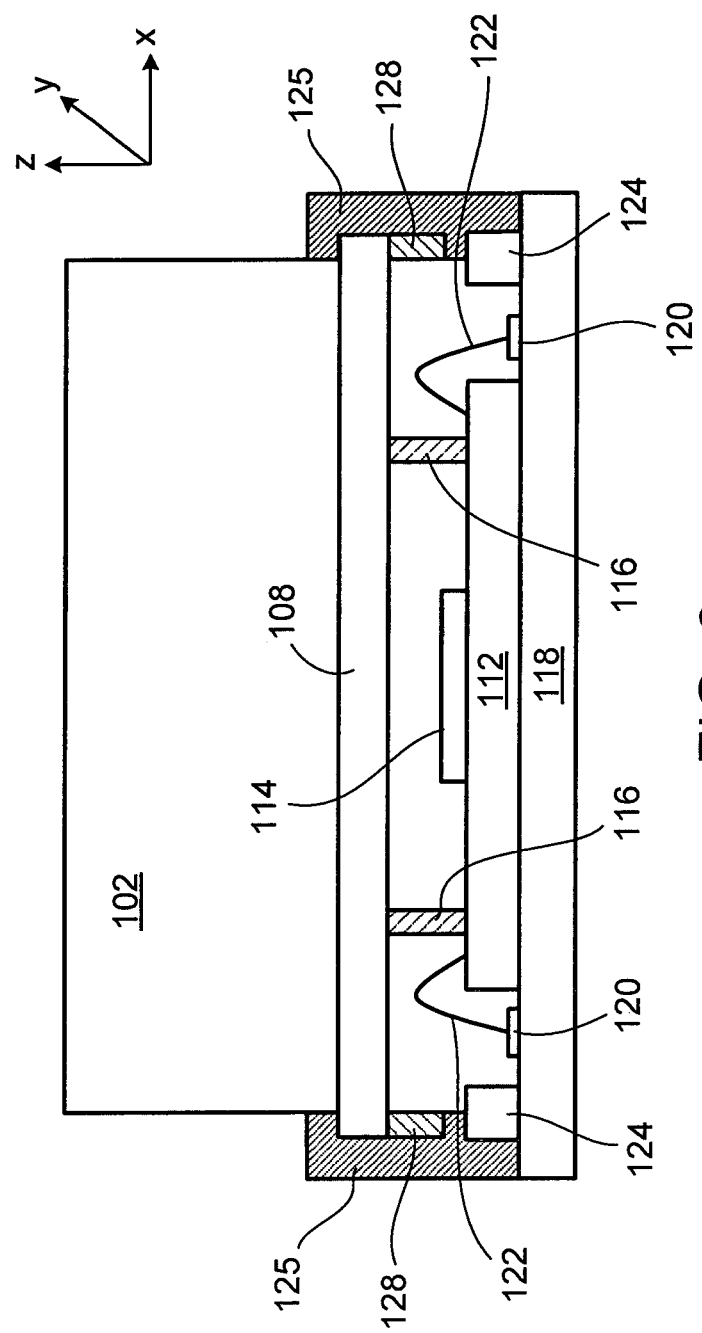
FIG. 6 illustrates another example of a camera module according to the invention.

Furthermore, in some implementations, it is possible to omit the separate fill material altogether. For example, if the lateral dimensions of the FFL correction substrate 108 and the lens stack 102 in the x-y directions are the same as (or very close to) one another, the dam structure can be placed sufficiently close to the FFL correction substrate that no further fill is needed. An example is illustrated in FIG. 6, which shows a dam structure 125 substantially flush against the sides the FFL correction substrate 108, which has lateral dimensions that are close to those of the lens stack 102. The dam structure 125 also is substantially flush side edges of the second spacer 128 and closes off a gap between the second spacer and the support 118 (or between the spacer 118 and another component 124 mounted on the support).

Multiple camera modules, as described above, can be fabricated at the same time, for example, in a wafer-level process. Generally, a wafer refers to a substantially disk- or plate-like shaped item, its extension in one direction (y-direction or vertical direction) is small with respect to its extension in the other two directions (x- and z- or lateral directions). On a (non-blank) wafer, multiple similar structures or items can be arranged, or provided therein, for example, on a rectangular or other shaped grid. A wafer (e.g., spacer wafers) can have openings or holes, and in some cases a wafer may be free of material in a predominant portion of its lateral area. In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. The wafer thickness can be, for example, between 0.2 mm and 10 mm, and in some cases, is between 0.4 mm and 6 mm. In some implementations of a wafer level process, there can be provisions for at least ten modules in each lateral direction, and in some cases at least thirty or even fifty or more modules in each lateral direction.

As part of the dam-and-fill process during wafer-level fabrication, any of the dam-and-fill techniques described in the background section can be used. For example, dam material can be added around the individual camera modules, and then the fill material (i.e., the encapsulant) is added between the camera modules and the dam. The wafer stack then can be separated (e.g., by dicing) to form multiple individual camera modules that include encapsulant to protect the conductive wires connecting the image sensor to the support (e.g., PCB substrate) on which the image sensor is mounted.

Other implementations are within the scope of the claims.

What is claimed is:

1. A compact camera module comprising:
   a stack of one or more optical elements;
   an optically transmissive substrate, wherein the stack of one or more optical elements is attached to a first side of the transmissive substrate;

an image sensor mounted on a support, wherein the optically transmissive substrate is separated from the image sensor by a first spacer attached to a second side of the transmissive substrate;

a second spacer attached to the transmissive substrate at or near a periphery of the transmissive substrate, wherein the second spacer extends from the transmissive substrate toward, but does not reach, the support on which the image sensor is mounted; and wires electrically coupling the image sensor to bond pads on the support on which the image sensor is mounted, wherein the wires are located in a space between the first and second spacers.

2. The camera module of claim 1 further including an encapsulant on side edges of the second spacer and substantially closing off a gap between the second spacer and the support on which the image sensor is mounted.

3. The camera module of claim 2 wherein the encapsulant also is on side edges of the transmissive substrate.

4. The camera module of claim 2 including a ventilation hole in the encapsulant to facilitate pressure control in the space where the wires and bond pads are located.

5. The camera module of claim 1 wherein the image sensor includes a photosensitive area that is encircled by the first spacer.

6. The camera module of claim 1 wherein the second spacer is attached to the second side of the transmissive substrate.

7. The camera module of claim 1 wherein the transmissive substrate provides focal length correction for one or more optical channels.

8. The camera module of claim 1 wherein the first and second spacers have the same height.

9. The camera module of claim 1 further including conductive pads on a surface of the support on which the image sensor is mounted, wherein wires are coupled to the conductive pads, which are located within the space between the first and second spacers.

10. The camera module of claim 1 further including:
another component mounted on the support directly below the second spacer; and
a encapsulant substantially closing off a gap between the second spacer and the other component mounted on the support.

11. The camera module of claim 1 including a dam structure adjacent the optically transmissive substrate, wherein the dam structure substantially closes off a gap between the second spacer and the support on which the image sensor is mounted.

12. A compact camera module comprising:
a stack of one or more optical elements;
an optically transmissive substrate wherein the stack of one or more optical elements is attached to a first side of the transmissive substrate;
an image sensor mounted on a support, wherein the optically transmissive substrate is separated from the image sensor by a first spacer attached to a second side of the transmissive substrate; and
a second spacer attached to the transmissive substrate at or near a periphery of the transmissive substrate, wherein the second spacer extends from the transmissive substrate toward, but does not reach, the support on which the image sensor is mounted;

wherein the optically transmissive substrate includes a middle section that has a first thickness, the substrate further including a second section near its periphery wherein the second section has a second thickness that is less than the first thickness, the camera module further including wires electrically coupling the image sensor to the support on which the image sensor is mounted, wherein one or more of the wires are located in a space that is between the first and second spacers and that is below the second section of the optically transmissive substrate.

13. The camera module of claim 12 further including an encapsulant on side edges of the second spacer and closing off a gap between the second spacer and the support on which the image sensor is mounted.

14. The camera module of claim 12 wherein the encapsulant also is on side edges of the transmissive substrate.

15. The camera module of claim 12 wherein the second spacer has a height greater than the height of the first spacer.

16. The camera module of claim 12 wherein a bottom of the second spacer is closer than a bottom of the first spacer to the support on which the image sensor is mounted.

17. The camera module of claim 12 wherein a top of the second spacer is closer than a top of the first spacer to stack of one or more optical elements.

18. The camera module of claim 12 wherein the image sensor includes a photosensitive area that is encircled by the first spacer.

19. The camera module of claim 12 wherein the stack of one or more optical elements is attached to the optically transmissive substrate by another spacer.

20. The camera module of claim 12 wherein the transmissive substrate provides focal length correction for one or more optical channels.

21. A compact camera module comprising:
a stack of one or more optical elements;
an optically transmissive substrate wherein the stack of one or more optical elements is attached to a first side of the transmissive substrate;
an image sensor mounted on a support, wherein the optically transmissive substrate is separated from the image sensor by a first spacer attached to a second side of the transmissive substrate; and
wherein the optically transmissive substrate includes a middle section that has a first thickness, the substrate further including a second section adjacent its periphery wherein the second section has a second thickness that is less than the first thickness such that a shortest distance from the support to an image sensor-side of the middle section is less than a shortest distance from the support to an image sensor-side of the second section, and wherein opposite surfaces of the middle section and opposite surfaces of the second section are parallel to one another, the camera module further including:
wires electrically coupling the image sensor to a printed circuit board substrate on which the image sensor is mounted, wherein one or more of the wires is connected to a portion of the image sensor located below the second section of the optically transmissive substrate; and
an encapsulant covering the wires.

* * * * *